United States Patent
Wachmann (10) Patent No.: US 12,408,449 B2
(45) Date of Patent: Sep. 2, 2025

(54) PHOTODIODE DEVICE WITH IMPROVED DARK CURRENT

(71) Applicant: ams-Osram AG, Premstätten (AT)

(72) Inventor: Ewald Wachmann, Kainbach (AT)

(73) Assignee: AMS-OSRAM AG, Premstaetten (AT)

( * ) Notice: Subject to any disclaimer, the term of this patent is extended or adjusted under 35 U.S.C. 154(b) by 419 days.

(21) Appl. No.: 18/010,972

(22) PCT Filed: Jun. 22, 2021

(86) PCT No.: PCT/EP2021/067002
§ 371 (c)(1),
(2) Date: Dec. 16, 2022

(87) PCT Pub. No.: WO2021/259932
PCT Pub. Date: Dec. 30, 2021

(65) Prior Publication Data
US 2023/0230985 A1 Jul. 20, 2023

(30) Foreign Application Priority Data
Jun. 24, 2020 (EP) .................... 20182030

(51) Int. Cl.
*H10F 71/00* (2025.01)
*H10F 30/221* (2025.01)
*H10F 39/00* (2025.01)
*H10F 39/10* (2025.01)
(Continued)

(52) U.S. Cl.
CPC ......... *H10F 39/107* (2025.01); *H10F 30/221* (2025.01); *H10F 39/802* (2025.01); *H10F 71/00* (2025.01); *H10F 77/241* (2025.01); *H10F 39/189* (2025.01)

(58) Field of Classification Search
CPC ...... H10F 39/107; H10F 71/00; H10F 30/221; H10F 39/802; H10F 77/241
See application file for complete search history.

(56) References Cited

U.S. PATENT DOCUMENTS

2006/0017072 A1   1/2006  Dosluoglu
2015/0287847 A1*  10/2015  Teva ................. H10F 30/221
                                                         257/459

FOREIGN PATENT DOCUMENTS

EP    3331034 A1    6/2018
WO    2014048730 A1    4/2014

OTHER PUBLICATIONS

Markmann (Authorized Officer), International Search Report dated Sep. 23, 2021, PCT Application No. PCT/EP2021/067002, 2 pages.

* cited by examiner

*Primary Examiner* — Suberr L Chi
(74) *Attorney, Agent, or Firm* — MH2 Technology Law Group LLP (57) ABSTRACT

The present disclosure relates to a photodiode device, which overcomes the drawbacks of conventional devices like increased dark currents. The photodiode device includes a semiconductor substrate, at least one doped well of a first type of electric conductivity at a main surface of the substrate and at least one doped region of a second type of electric conductivity being adjacent to the doped well. The at least one doped well and the at least one doped region are electrically contactable. On a portion of an upper surface of the doped well a protection structure is arranged. The protection structure protects the upper surface of the underlying doped well from an etching process for removing a spacer layer.

16 Claims, 5 Drawing Sheets

(51) Int. Cl.
*H10F 77/20* (2025.01)
*H10F 39/18* (2025.01)

PHOTODIODE DEVICE WITH IMPROVED DARK CURRENT

CROSS-REFERENCE TO RELATED APPLICATIONS

The present application is the national stage entry of International Patent Application No. PCT/EP2021/067002, filed on Jun. 22, 2021, and published as WO 2021/259932 A1 on Dec. 30, 2021, which claims the benefit of priority of European Patent Application No. 20182030.5, filed on Jun. 24, 2020, all of which are incorporated by reference herein in their entireties.

FIELD OF INVENTION

The invention relates to a photodiode device, an electronic system and a method of producing a photodiode device.

BACKGROUND OF THE INVENTION

There is an increasing demand for photodetectors with high sensitivity and spectral responsivity, the photodetectors therefore requiring low dark currents. Important fields of usage of such photodetectors are medical applications like Computed Tomography (CT). Computed tomography systems make use of x-rays to generate a three dimensional picture of solid objects, e.g. the human body. A scintillator transforms the x-rays into visible light, which is then detected with the help of an array of photodiodes. The photodiodes can be connected with a CMOS circuit by wafer-to-wafer bonding, by flip-chip assembly of semiconductor chips, or by monolithic integration of CMOS components and photodiodes in the same semiconductor device. Apart from being a very cost-effective solution, a monolithic integration provides the best interconnection between the photodiodes and the CMOS circuitry. However, semiconductor materials that are suitable for CMOS circuits may cause difficulties in integrating photodiodes with respect to low dark current, low capacitance, high sensitivity, short response time, and radiation hardening simultaneously.

It is an object of the invention to provide a photodiode device with improved dark current. It is further an object to provide a method of producing a photodiode device with improved dark current.

This object is achieved with the photodiode device and the method of producing a photodiode device according to the independent claims. Embodiments derive from the dependent claims.

SUMMARY OF THE INVENTION

In an embodiment the photodiode device comprises a semiconductor substrate with a main surface. At least one doped well of a first type of electric conductivity is arranged at the main surface of the substrate. Furthermore, at least one doped region of a second type of electric conductivity is arranged at the main surface of the substrate, wherein the doped region is adjacent to the at least one doped well. The second type of electric conductivity is opposite to the first type of electric conductivity. The at least one doped well and the at least one doped region are electrically contactable. On a portion of an upper surface of the doped well a protection structure is arranged. The upper surface is arranged at the main surface of the substrate. The protection structure protects the doped well against defects at the upper surface.

The semiconductor substrate has a main plane of extension. The main surface of the semiconductor substrate runs parallel to the main plane of extension. The semiconductor substrate comprises, for example, silicon. The semiconductor substrate may have a base doping, in particular a base doping of the second type of electric conductivity. In a preferred embodiment the semiconductor substrate comprises a higher doped wafer and a lower doped epi-layer, which is epitaxially grown on the wafer. The main surface may be formed by the epi-layer.

The at least one doped well is arranged at the main surface of the substrate. In particular, the doped well may be formed within the epi-layer. The doped well has a first type of electric conductivity, wherein the first type of conductivity is opposite to the second type of electric conductivity. For example, the first type of electric conductivity is n-type and the second type of electric conductivity is p-type or vice versa. The doped well has an extent in lateral directions, wherein lateral directions run parallel to the main plane of extension of the substrate. The doped well also has an extent in a transversal directions, wherein the transversal direction is perpendicular to the lateral directions. In the transversal direction the doped well reaches from the main surface of the substrate to a certain depth into the substrate. This can mean that the doped well is embedded in the epi-layer of the semiconductor substrate. The doped well forms a pn-junction with the substrate. By means of the pn-junction a photodiode is formed. The photodiode is provided to convert electromagnetic radiation into an electric signal.

The at least one doped region has the second type of electric conductivity. This means that the doped region has the same type of conductivity as the substrate. The doped region is arranged at the main surface of the substrate. In lateral directions, the doped region is adjacent to the doped well. This means that the doped region is in direct contact with the doped well at the main surface of the substrate. The doped region surrounds the doped well in lateral directions. In the transversal direction, the doped region extends less into the substrate than the doped well.

The doped well and the doped region can be contacted electrically. In case that the doped well in n-type an electric contact contacting the doped well forms a cathode terminal. Accordingly, an electric contact contacting the doped region, which is p-type in this case, forms an anode terminal. As mentioned above, the types of electric conductivity of the doped well and the doped region can be reversed.

The doped well comprises an upper surface, which is arranged at the main surface of the substrate. This means that the upper surface of the doped well is on a same level with the main surface and forms a part of the main surface.

On a portion of the upper surface a protection structure is arranged. The protection structure is arranged above the upper surface of the doped well. The protection structure may comprise a semiconductor material or any other material, which is compatible with semiconductor processes. In particular, the protection structure may comprise polysilicon. The protection structure may have a lateral extent, which corresponds to the lateral extent of the doped well. The protection structure is provided to protect the doped well against defects at the upper surface. These defects could potentially be caused by etching procedures in the fabrication process of the photodiode device or by electromagnetic radiation, especially by electromagnetic radiation in the x-ray wavelength range.

Advantageously, the photodiode device avoids the usage of a field-oxide at the main surface of the substrate by means of the doped region, which in lateral directions completely surrounds the doped well and is in direct contact with the doped well. In conventional devices, where a field-oxide is used, the speed of photodiode is impaired by the Fermi-level pinning effect underneath field-oxide regions. This effect is mostly present in p-type semiconductors typically used in standard CMOS processes. By banding the conduction and valence band, respectively, charge carriers are accumulated underneath the field-oxide that translate to a slow turn-on behaviour. This slow response is most pronounced for low current levels. That means that after an excitation pulse the photo current remains at the level of the dark current for several tens of milliseconds until the photodiode eventually produces the desired photocurrent. The same mechanism deteriorates the leading edge of a photocurrent pulse after illumination is turned on, causing decreased sensitivity of the photo detector for several integration periods of the analog-to-digital converter (ADC) readout circuitry.

By applying the doped region, which may be a very shallow, highly doped p-type implantation region, these issues are addressed and the response of the photodiode is increased. Furthermore, the doped region, which is exposed to electromagnetic radiation, provides a good surface passivation and guarantees radiation tolerance of the device. For example, the doped region protects the underlying layers from damage caused by x-ray radiation. This kind of surface passivation works well for the spectral region of interest without deteriorating or having adverse side effects on the photodiode capacitance. Furthermore, minority carriers are repelled away from the main surface due to the doped region usually having a high doping concentration. Thus, the spectral responsivity of the photodiode device is increased and the dark current is decreased.

Moreover, the dark current is further decreased by applying the protection structure on the upper surface of the doped well. Usually, the doped well has a lower doping concentration than the doped region. This is why defects on its upper surface would lead to an increased dark current by means of an increased surface roughness and the generation of charge traps. The protection structure protects the upper surface from defects, which are in particular generated by etching steps in the fabrication process. It has been found that applying the protection structure reduces the dark current by a factor of 2 to 3. The spectral responsivity of the photodiode device is only insignificantly (<0.5%) reduced by the protection structure due to shadowing.

The photodiode device can be monolithically integrated into a CMOS-integrated circuit. The monolithic integration offers huge advantages over a discrete solution consisting of a discrete photo diode array and a discrete ASIC, namely yield, cost and performance.

In another embodiment the photodiode device further comprises a contact region arranged on the upper surface of the doped well. The contact region has a doping concentration that is higher than the doping concentration of the doped well.

The contact region has the same type of electric conductivity as the doped well. The contact region is arranged within the doped well and its lateral extent is smaller than the lateral extent of the doped well. Advantageously, the contact region enables the formation of an Ohmic contact.

In another embodiment of the photodiode device the protection structure forms a ring or a frame around the contact region of the doped well in a top-view.

The top-view refers to a view on the photodiode device from a side of the protection structure facing away from the substrate in the transversal direction. This means that in lateral directions the protection structure surrounds the contact region. The contact region may be placed in the center of the doped well, whereas the protection structure covers the doped well in peripheral regions. An inner diameter of the ring or the frame may correspond to the lateral extent of the contact region. An outer diameter of the ring or the frame may correspond to the lateral extent of the doped well.

In a further embodiment the extent of the protection structure is limited to the upper surface of the doped well. This means that the protection structure is exclusively arranged on the doped well, but not on the doped region. However, in another embodiment the protection can slightly overlap the border between the doped well and the doped region.

Advantageously, the higher doped contact region of the doped well is placed at the upper surface at the center of the doped well, so that it is not in direct contact with the doped region. This way, the junction capacitance between the doped well and the doped region is kept low and the dark current further decreases. The mayor portion of the upper surface is covered by the protection structure, so that the lower doped well is protected from surface defects. Preferably, the protection structure only covers the doped well, but not the doped region. The doped region usually has a high doping concentration, which already passivates the main surface of the substrate sufficiently. On the other side, the protection structure may deteriorate the photodiode's spectral responsivity due to shadowing, so that the lateral extent of the protection structure should be restricted to the upper surface of the doped well.

In another embodiment of the photodiode device the protection structure comprises polysilicon. Advantageously, polysilicon is used anyway in the fabrication process, for example as gate electrode of metal-oxide-semiconductor field-effect transistors (MOSFET) of the CMOS process. Therefore, the use of polysilicon as protection structure is easy to implement and very cost-effective. Moreover, polysilicon may be transparent for the electromagnetic radiation in the wavelength range to be detected. Here and in the following "transparent" refers to a transparency of at least 80% or at least 90%. A protection structure comprising polysilicon attenuates the electromagnetic radiation at least insignificantly.

In another embodiment of the photodiode device the doped region comprises a higher doping concentration than the doped well. As mentioned above, the electric conductivity type of the doped well is opposite to the electric conductivity type of the doped region. If the semiconductor substrate is p-type, the doped region is p-type as well, whereas the doped well is n-type. In this case, the doped well may have a doping concentration which is typical for so-called n-wells in a CMOS fabrication process. However, the doping concentration of the doped region may be typical for source or drain regions of a p-type MOSFET.

Advantageously, the junction capacitance between the doped well and the doped region can be kept low due to the lower doping concentration of the doped well.

In another embodiment the photodiode device further comprises a dielectric layer arranged between the upper surface of the doped well and the protection structure. The dielectric layer may comprise an oxide, for example, silicon oxide. In a preferred embodiment, the dielectric layer is formed by the gate oxide of a CMOS process. This means that the dielectric layer comprises a thermal oxide of high quality. In the transversal direction, the dielectric layer may be thin. For example, the thickness is in the range of a view nanometers. Since the dielectric layer has high quality, its thickness can be controlled very accurately and the dielectric layer is nearly defect free. In particular, the interface of the dielectric layer to the upper surface of the doped well is defect free. Advantageously, the dark current of the photodiode device is reduced due to the defect free or nearly defect free interface of the upper surface.

In another embodiment the photodiode device further comprises a wiring layer arranged above the main surface of the substrate. At least one conductor track is arranged within the wiring layer, wherein the at least one doped well is electrically connected to the conductor track. Besides, at least one further conductor track is arranged within the wiring layer and is electrically connected to the at least one doped region. The conductor track and the further conductor track are embedded in the wiring layer.

The wiring layer is a further dielectric layer. The wiring layer may be an intermetal dielectric like silicon oxide, which is generally used for wirings of CMOS devices, for instance. The conductor track and the further conductor track may be formed by metal layers embedded in the wiring layer. For example, the conductor track and the further conductor track comprise aluminum.

The conductor track may be arranged above the doped well. However, the mayor part of the doped well is not covered by the conductor track, so that electromagnetic radiation can reach the upper surface of the doped well unhindered. The further conductor track may be arranged above the doped region. However, the mayor part of the doped region is not covered by the conductor track, so that electromagnetic radiation can reach the main surface of the substrate unhindered.

Besides of the conductor track, which electrically connects the doped well, and the further conductor track, which electrically connects the doped region, further metal layers may be arranged within the wiring layer. The conductor track and the further conductor track may also be electrically connected to an optional CMOS circuitry placed aside the photodiode device or to an electrical contact for external contacting. Advantageously, the doped well and the doped region can be electrically contacted by means of a conventional CMOS metallization.

In another embodiment the photodiode further comprises a contact plug arranged on the contact region electrically connecting the conductor track to the doped well. A further contact plug is arranged on the doped region, wherein the further contact plug electrically connects the further conductor track to the doped region.

The contact plug is arranged between the contact region and the conductor track in the transversal direction. Moreover, the contact plug physically and electrically connects the conductor track with the contact region. The further contact plug is arranged between the doped region and the further conductor track in the transversal direction. Moreover, the further contact plug physically and electrically connects the further conductor track with the doped region. The contact plug and the further contact plug may comprise a metal, for example tungsten. By means of the contact plug and the further contact plug the doped region and the doped well can be electrically contacted.

In another embodiment the photodiode device comprises a plurality of doped wells with respective protection structures, the doped wells being spaced apart from each other and being adjacent to the at least one doped region. Furthermore, the doped wells are connected to each other.

The doped wells are arranged adjacent to the at least one doped region.

This can mean, that the doped wells and the doped region can be arranged next to each other in lateral directions. Each of the doped wells can be in direct contact with the at least one doped region. The doped wells can be distributed in a regular or irregular way. In top-view, the doped wells form islands on the main surface of the substrate. On the upper surface of each doped well a respective protection structure is arranged as described above. In an embodiment the doped wells are electrically connected to each other by means of the at least one conductor track or by a plurality of conductor tracks, which are interconnected. This means the doped wells are electrically connected in parallel to each other. In another embodiment, at least some of the doped wells are interconnected. For example, a first group of the doped wells is electrically connected in parallel with each other via a first one of the conductor tracks. A second group of the doped wells can be electrically connected parallel with each other via a second one of the conductor tracks. In this way, the doped wells together form a single photodetector.

Advantageously, the described configuration with a plurality of doped wells forming islands on the main surface of the substrate exhibits a low capacitance and a low dark current. The capacitance of the photodiode device is dependent from the space charge regions formed by the pn-junctions. However, in this arrangement the space charge region is limited to the pn-junctions formed by the doped wells, which cover a relatively small area of the entire main surface of the substrate.

In another embodiment of the photodiode device the plurality of doped wells is comprised by one pixel of an array of pixels of the photodiode device. This means that the plurality of doped wells is provided for one pixel, which may be a pixel of an array of pixels intended for image detection. A further plurality of doped wells may be provided for another pixel within that array.

The pixels may be separated by a guard ring or by a trench, so that crosstalk between the pixels is avoided. The doped wells of one pixel are interconnected via the at least one conductor track, however, they are not connected to the doped wells of another pixel. This means that the conductor tracks are interconnected for each pixel separately.

Advantageously, the sensitivity to electromagnetic radiation is large since nearly all charge carriers generated by the electromagnetic radiation within one pixel can be collected by the anode and cathode terminals. Collecting the charge carriers can therefore be conducted very effectively.

In another embodiment of the photodiode device the electromagnetic radiation to be detected is in the infrared, the near-infrared or in the visible wavelength range, or in a range overlapping at least two of these wavelength ranges.

Advantageously, the semiconductor materials comprised by the photodiode device are suitable for detecting electromagnetic radiation in the desired wavelength range due to their material properties. Furthermore, the optoelectronic device can be designed to be suitable for various wavelength regimes. This allows its usage in different applications.

In another embodiment the photodiode device is comprised by an electronic system. The electronic system is in particular a computed tomography system or any other optoelectronic system. The electronic system may be an optoelectronic system provided for sensing electromagnetic radiation. In particular, the optoelectronic system may require high sensitive photodiode devices, which therefore exhibit low dark current levels.

For example, the electronic system is a computed tomography (CT) system. In the field of CT, X-ray radiation with several tens of keV are used to construct a three dimensional picture of the human body. The x-rays are detected via a scintillator that transforms the x-rays into electromagnetic radiation detectable by the photodiode device. For example, the scintillator transforms the x-rays into visible light, which is then detected with the help of an array of photodiodes. The scintillator may be arranged above the main surface of the substrate or above the wiring layer.

However, some x-rays may reach the substrate unconverted. The x-rays tend to stress the photodiode device as well as the read out circuitry and cause a degradation of the dark current, the spectral responsivity and the temperature coefficients of these two quantities (dark current temperature coefficient (DCTC), spectral responsivity temperature coefficient SRTC). The proposed photodiode device comprises an insular junction layout to achieve a low dark current and a low capacitance. Advantageously, the photodiode device is radiation hard. This is because the doped region passivates the main surface of the substrate. Besides, the protection structure protects the upper surface of the doped well.

In an embodiment of producing a photodiode device, the method comprises providing a semiconductor substrate and forming, by implantation of a dopant, at least one doped well of a first type of electric conductivity at a main surface of the substrate. The method further comprises depositing a protection structure on a portion of an upper surface of the doped well, where the upper surface is arranged at the main surface of the substrate. The method further comprises depositing a spacer layer covering the main surface of the substrate and the protection structure. The spacer layer is removed by an etching process, wherein the protection structure protects the upper surface of the underlying doped well from the etching process. The method further comprises forming, by implantation of a further dopant, at least one doped region of a second type of electric conductivity at the main surface of the substrate. The doped region is adjacent to the at least one doped well. The second type of electric conductivity is opposite to the first type of electric conductivity.

In case that the base doping of the semiconductor substrate is p-type, the dopant of the implantation forming the doped well could be phosphorus and/or arsenic. The implantation domain can be defined by means of a photolithographic mask. The implantation step could be followed by a thermal annealing, which causes the dopants to diffuse deeper into the substrate and to be activated.

Before depositing of the protection structure a dielectric layer could be formed on the main surface of the substrate and on the upper surface of the doped well. The dielectric layer could be an oxide layer, which is formed by means of a thermal oxidation. The dielectric layer could be a gate oxide.

The protection structure can be deposited on top of the dielectric layer and structured by means of a photolithographic technique, so that the protection structure is arranged above the doped well. In an embodiment the protection structure comprises polysilicon. The deposition and structuring of the protection structure can also be used for forming gate electrodes of an optional CMOS circuitry arranged aside the photodiode device.

After deposition of the protection structure the spacer layer is deposited on top of the main surface and the protection structure. The spacer layer can comprise an oxide or a nitride or a combination of both. After that, the spacer layer is removed by an etching step. In particular, the etching step is a dry etching step. The etching step may be controlled by time in such a way that the spacer layer is completely removed on the main surface of the substrate as well as on the protection structure. An over-etching could be performed to assure the removal of the spacer layer. However, residuals of the spacer layer may remain next to the protection structure. This means that in lateral directions so-called spacers are adjacent to the protection structure.

Since in a preferred embodiment the photodiode device is integrated side by side to a CMOS circuitry, polysilicon as well as oxide and nitride depositions take place anyway. Usually, the spacers next to the gate electrode are used to define the drain and source regions of a field-effect transistor.

Thus, in case no protection structure was used to cover the doped wells of the photodiode device, the etching step and in particular the over-etching for removing the spacer layer would attack the upper surface of the doped well. This would lead to an increased surface roughness and thus to an increased dark current of the device. This means that the protection structure protects the upper surface of the underlying doped well from the etching process.

The dopant for the further implantation forming the doped region may be boron. Forming the doped region can be conducted by one or more than one implantation steps. For example, a first implantation step for forming the doped region can be performed before the deposition of the spacer layer. A second implantation step can be performed after removing the spacer layer. The implantation domain can be defined by means of a photolithographic mask.

Advantageously, the photodiode device can be formed by a standard CMOS process, where the deposition of polysilicon as well as the deposition of a spacer nitride and/or a spacer oxide is performed anyway. In a conventional photodiode arrangement removing the spacer nitride and/or the spacer oxide would harm the upper surface of the doped well. However, the proposed fabrication process introduces the deposition of a protection structure, which could comprise the same material as the gate electrodes and which protects the upper surface of the doped well against defects generated by the spacer nitride removal.

In another embodiment the method further comprises forming by implantation a contact region on the upper surface of the doped well, so that, in a top-view, the protection structure forms a ring or a frame around the contact region of the doped well. The contact region has a doping concentration that is higher than the doping concentration of the doped well.

In case that the doped wells are n-type, the dopant of the implantation forming the contact region may comprise phosphorus or arsenic. Forming the contact region can be conducted by one or more than one implantation steps. For example, a first implantation step for forming the contact region can be performed before the deposition of the spacer layer. A second implantation step can be performed after removing the spacer layer. The implantation domain can be defined by means of a photolithographic mask.

The contact region is arranged within the doped well and its lateral extent is smaller than the lateral extent of the doped well. This means that in lateral directions the protection structure surrounds the contact region. The contact region may be placed in the center of the doped well, whereas the protection structure covers the doped well in peripheral regions. Advantageously, the higher doped contact region of the doped well is placed in the center of the doped well, so that it is not in direct contact with the doped region. This way, the junction capacitance between the doped well and the doped region is kept low and the dark current further decreases.

In another embodiment of the method an implantation domain for forming the at least one doped well overlaps in lateral directions a further implantation domain for forming the at least one doped region. Lateral directions extend parallel to a main plane of extension of the substrate.

Since the doping concentration of the doped region is higher than the doping concentration of the doped well, the overlapping region has the second type of conductivity and forms a portion of the doped region at the main surface of the substrate. The overlap of the implantation domain and the further implantation domain is important to achieve a low dark current avoiding leakage current contribution from this area. By means of the overlap the position of the pn-junction between the doped region and the doped well as well as its gradient of doping concentrations can be controlled accurately.

Further implementations of the photodiode device and of the method of producing the photodiode device become readily apparent for the skilled person from the various descriptions made with respect to the embodiments mentioned above.

The photodiode and the method of producing the photodiode device will be described in more detail in the following with the aid of drawings. Elements having the same or similar function bear the same reference numerals throughout the drawings. Hence their description is not necessarily repeated in subsequent drawings.

DETAILED DESCRIPTION

Figure 1:
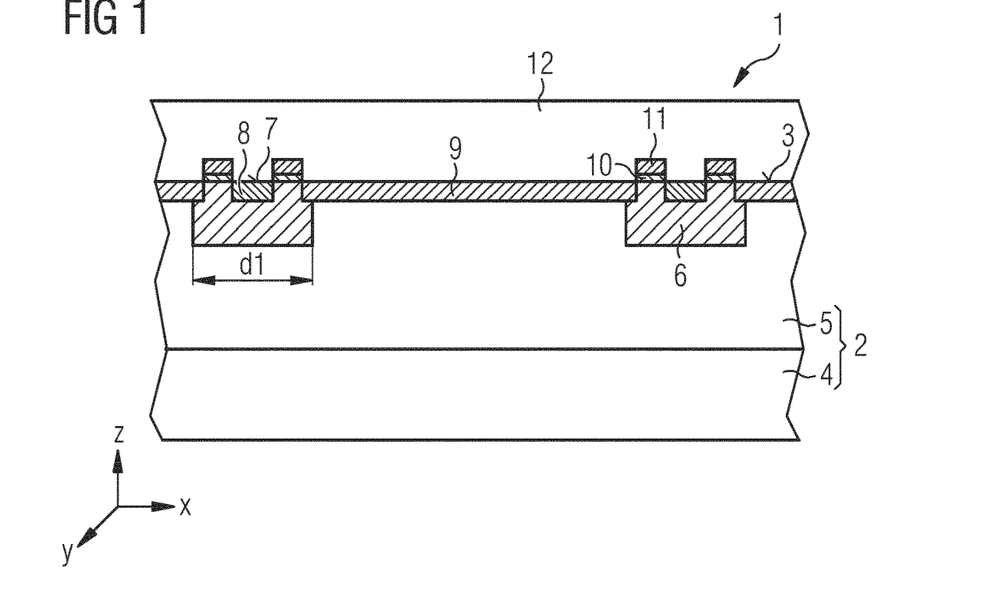
FIG. 1 shows a cross-section of an embodiment of a photodiode device.

In FIG. 1 a schematic of an embodiment of a photodiode device 1 is shown. The photodiode device comprises a semiconductor substrate 2 with a main surface 3. The substrate has a main plane of extension. The main surface 3 extends in lateral directions x, y, wherein the lateral directions x, y run parallel to the main plane of extension of the substrate 2. The substrate 2 comprises a highly doped wafer 4 and a lower doped epi-layer 5. The epi-layer is arranged in a transversal direction z on top of the wafer, wherein the transversal direction z is perpendicular to the main plane of extension of the substrate 2. The main surface 3 is thus formed by the epi-layer 5. The doping of the substrate 2 is such that the substrate 2 is of a second type of electric conductivity, which is opposite to a first type of electric conductivity. For example, the second type of electric conductivity is p-type.

At the main surface 3 of the substrate 2 two doped wells 6 are formed. The doped wells 6 are of the first type of electric conductivity, for example n-type. The doped wells 6 have an extent in lateral directions x, y. For example, a lateral extent d1 of the doped wells 6 is in the range of few micrometers. Furthermore, the doped wells 6 also extend in the transversal direction z. This means that the doped wells 6 reach from the main surface 3 into the substrate 2. The doped wells 6 comprise an upper surface 7. The upper surface 7 is arranged at the main surface 3 of the substrate 2. This means that in the transversal direction z the upper surface 7 is on the same level as the main surface 3.

The doped wells 6 each further comprise a contact region 8 placed on the upper surface 7 of the doped wells 6. The contact region 8 has the same type of electric conductivity as the doped well 6, but comprises a higher doping concentration, so that an Ohmic contact can be established. In lateral direction x, y the contact region 8 is placed in the center of the doped well 6. This means that the doped well 6 surrounds the contact region 8 in lateral directions x, y.

On regions of the main surface 3, where no doped wells 6 are present, a doped region 9 is arranged at the main surface 3. The doped region 9 is therefore adjacent to the doped wells 6. This means that in lateral directions x, y the doped region 9 is in direct contact with doped wells 6. The doped region 9 can cover the entire main surface 3 except those portions of the main surface 3, where doped wells 6 are arranged. FIG. 1 shows that the doped region 9 covers the entire area of the main surface 3 between the doped wells 6. The doped region 9 is doped for the second type of electric conductivity. The doped region 9 has a doping concentration that is higher than the doping concentration of the substrate 2 and in particular the doping concentration of the epi-layer 5.

In the transversal direction z, the doped region 9 is shallower than the doped wells 6. This means that the doped wells 6 reach deeper into the substrate 2. In regions of the substrate 2 below the doped region 9 the doped wells 6 can overlap the doped region 9 in lateral directions x, y. This means that in those regions the doped region 9 can be arranged above the doped wells 9. This also means that the lateral extent d1 of the doped wells 6 can be smaller at the main surface 3 of the substrate 2 than in deeper regions of the substrate 2 below the doped region 9.

On the upper surface 7 of the doped well 6, which is not formed by the contact region 8, a dielectric layer 10 is arranged. This means that the dielectric layer 10 forms a ring or a frame around the contact region 8. In lateral directions x, y the dielectric layer 10 is restricted by the contact region 8 on the one side and by the doped region 9 on the other side. In the transversal direction z the dielectric layer 10 can be thin, for example a few nanometers.

On top of the dielectric layer 10 a protection structure 11 is arranged. This means that the dielectric layer 10 is arranged between the doped well 6 and the protection structure 11. Like the dielectric layer 10 the protection structure 11 is restricted by the contact region 8 on the one side and by the doped region 9 on the other side in lateral directions x, y.

The embodiment shown in FIG. 1 also comprises a wiring layer 12 arranged on the main surface 3 and on the protection structures 11. Thus, the wiring layer 12 may cover the entire photodiode device. Within the wiring layer 12 conductor tracks 13, 14 (not shown) can be arranged for contacting the doped wells 6 and the doped region 9.

In another embodiment the dielectric layer 10 and/or the protection structure 11 can also slightly overlap the contact region 8 and/or the doped region 9 in the lateral directions x, y, which however is not shown in FIG. 1. Furthermore, the dielectric layer 10 and/or the protection structure 11 can also be slightly narrower than the upper surface 7, so that apart from the contact region 8 further regions of the upper surface 7 of the doped well 6 exist, which are uncovered from the dielectric layer 10 and/or the protection structure 11. Such an arrangement is shown in a top-view in FIG. 2.

Figure 2:
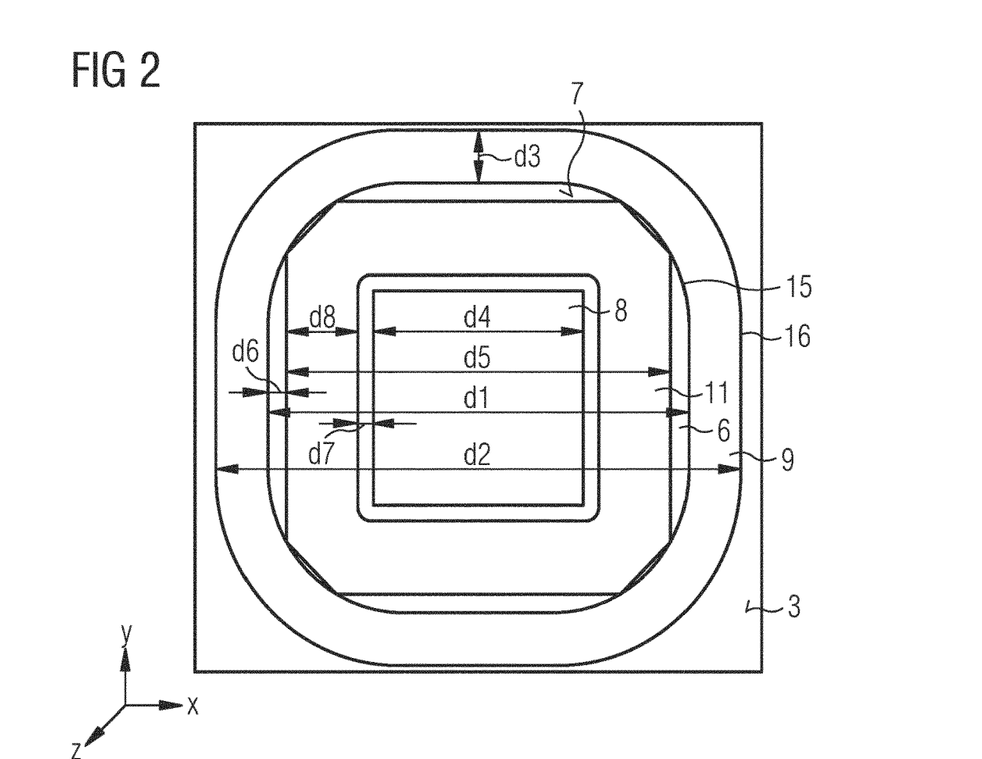
FIG. 2 shows a top-view of a layout of an embodiment of a photodiode device.

In FIG. 2 a layout of a photodiode device is shown in a top-view. The top-view refers to a view on the photodiode device 1 from a side of the protection structure 11 facing away from the substrate 2 in the transversal direction z.

FIG. 2 shows a border 15 of an implantation domain for forming the doped region 2. The doped region 9 covers the entire main surface 3 outside the circle-like area formed by the border 15. FIG. 2 further shows a border 16 of an implantation domain for forming the doped well 6. The implantation domain for forming the doped well 6 covers the circle-like area inside the border 16. This means that in lateral directions x, y the implantation domain for forming the doped well 6 has a lateral extent d2.

There is an overlap d3 of the implantation domain for forming the doped well 6 and the implantation domain for forming the doped region 9. However, the doping concentration of the doped region 9 is higher than the doping concentration of the doped well 6. Therefore, the net doping concentration of the overlap d3 at the main surface 3 is of the second type of electric conductivity. Therefore, the overlap d3 forms a part of the doped region 9. This means that at the main surface 3 the lateral extent d1 of the doped well 6 is decreased compared to the lateral extent d2 of the implantation domain for forming the doped well 6.

The contact region 8 is placed in the center of the doped well 6. This means that in lateral directions x, y the contact region 8 is enclosed by the doped well 6. In the shown example the contact region 8 has a rectangular shape in top-view. However, different shapes of the contact region 8 are also possible. In lateral direction x, y the contact region 8 has a width d4.

The protection structure 11 is arranged on the upper surface 7 of the doped well 6. The protection structure 11 has a frame-like shape surrounding the contact region 8 in lateral directions x, y. An outer diameter d5 of the protection structure 11 is slightly smaller than the lateral extent d1 of the doped well 6. Therefore, there is a gap d6 at the periphery of the upper surface 7 of the doped well 6, which is not covered by the protection structure 11. Besides, the inner diameter of the protection structure 11 is slightly larger than the contact region 8. Therefore, there is a further gap d7 at the upper surface 7 of the doped well 6 adjacent to the contact region 8, which is not covered by the protection structure 11. In a preferred embodiment the protection structure 11 covers the upper surface 7 of the doped well 6 as much as possible. Therefore, the design of the protection structure 11 is chosen in such a way, that the gap d6 and the further gap d7 is as small as possible. For this purpose the corners of the protection structure 11 may be cut in order to increase a width d8 of the protection structure 11, as shown in FIG. 2.

Figure 3:
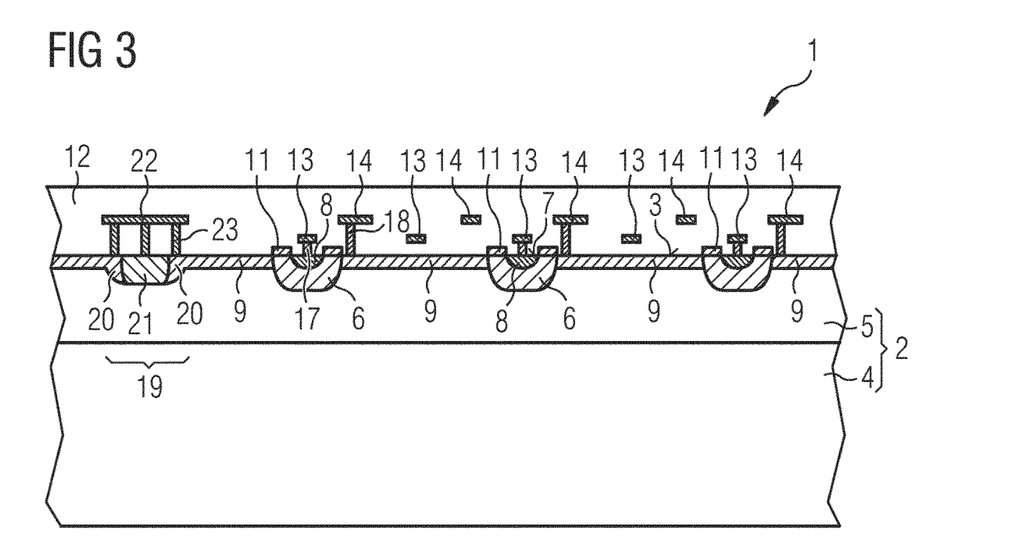
FIG. 3 shows a cross-section of another embodiment of a photodiode device.

FIG. 3 shows a cross-section of another embodiment of the photodiode device 1. FIG. 3 is different from FIG. 1 in that is shows conductor tracks 13 and further conductor tracks 14 embedded in the wiring layer 12, which is applied on or above the main surface 3. Thus, the wiring layer 12 may be an intermetal dielectric like silicon oxide, which is generally used for wirings of CMOS devices, for instance.

The conductor tracks 13 are electrically connected with the doped wells 6 by contact plugs 17, which are applied on the contact regions 8 of the doped wells 6. The contact regions 8 comprise a doping concentration that is higher than the doping concentration of the doped wells 6 and thus enable the formation of Ohmic contacts.

The further conductor tracks 14 may be electrically connected to the doped region 9 by further contact plugs 18. The high doping concentration of the doped region 9 allows the formation of Ohmic contacts. As shown in FIG. 3, the further contact plugs 18 may be arranged in the immediate vicinity of the doped wells 6, close to the pn-junctions that are formed between the doped wells 6 and the doped region 9. However, the doped region 9 may also be contacted via the further contact plugs 18 and the further conductor tracks 14 in the periphery of the pixel, i.e. distant from the pn-junction.

FIG. 3 shows the conductor tracks 13 as portions of a structured lower metallization level, and the further conductor tracks 14 as portions of a structured higher metallization level. The level of the conductor tracks 13 may instead be higher than the level of the further conductor tracks 14, or the conductor tracks 13 and the further conductor tracks 14 may be formed by the same metallization layer. The further conductor tracks 14 may instead be applied directly on the doped surface region 9 in the area between the doped wells 6.

FIG. 3 also shows a guard ring 19, which reduces crosstalk between neighboring pixels 24, 25 (not shown). In the example shown in FIG. 3, the guard ring 19 comprises an optional boundary region 20 and a core region 21. The boundary region 20 has the same type of conductivity as the doped surface region 9, and the core region 21 has the opposite type of conductivity. A metal layer 22, which may be provided above and along the guard ring 19, is electrically connected to both the boundary region 20 and the core region 21 by a plurality of contact plugs 23. The metal layer 22 can be provided for the entire pixel array as a common electric terminal of the further conductor tracks 14. Instead of the guard ring 19, a trench (not shown) can also be used for reducing crosstalk between neighboring pixels.

As mentioned above, the doped wells 6 may especially have n-type electric conductivity, if the doped region 9 has p-type electric conductivity. In this case the conductor tracks 13 are provided as cathode terminals, and the further conductor tracks 14 are provided as anode terminals. The types of electric conductivity can instead be reversed.

FIG. 3 is further different from FIG. 1 in that is does not show a dielectric layer 10 between the upper surface 7 of the doped well 6 and the protection structure 11. In this case, the protection structure 11 is in direct contact with the upper surface 7 of the doped well 6.

Figure 4:
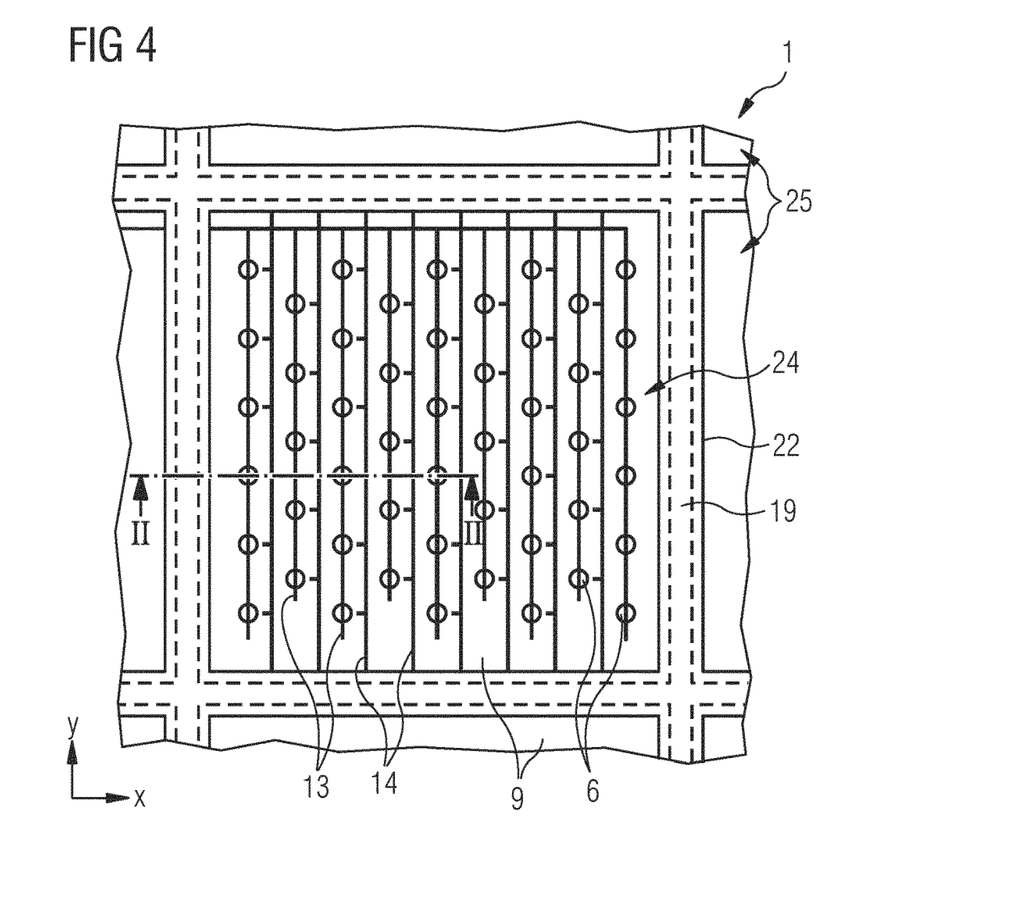
FIG. 4 shows a top-view of the embodiment shown in FIG. 3.

FIG. 4 is a top view of the photodiode device 1 according to the cross-section shown in FIG. 3. The position of the cross-section is indicated in FIG. 4 by a dotted line. Hidden contours are represented by broken lines.

FIG. 4 shows a plurality of doped wells 6, which are provided for one pixel 24, which may be a pixel 24 of an array of pixels 24, 25 intended for image detection. The plurality of doped wells 6 is surrounded by the guard ring 19, which does not divide or intersect the area where the plurality of doped wells 6 is arranged. Thus, the guard ring 19 defines the pixel area in lateral directions x, y. Further pixels 25 are indicated in FIG. 4 beyond the guard ring 19. The number of doped wells 6 is arbitrary as well as their arrangement. The arrangement shown in FIG. 4 is only an example of a suitable pattern. The distances between the doped wells 6 and their shapes can also be modified and adjusted to the requirements of individual embodiments.

The doped region 9 occupies the entire main surface 3 except for the areas of doped wells 6, which are spaced apart from one another. Thus an arrangement of insulation regions, like shallow trench isolations or field oxide regions, is avoided.

The doped wells 6 are electrically connected by means of conductor tracks 13. Further conductor tracks 14 are arranged separate from the conductor tracks 13. The further conductor tracks 14 are electrically connected to the doped region 9. Instead, the electric potential of the doped region 9 may be left floating. The conductor tracks 13 and the further conductor tracks 14 may be parallel and in alternating sequence, as shown in FIG. 4 by way of example.

A metal layer 22 is optionally arranged above and along the guard ring 19. The metal layer 22 may be provided as a common electric terminal for the further conductor tracks 14, as shown in FIG. 4 by way of example. As shown in FIG. 4, a common electric terminal of the conductor tracks 13 can be connected to a control or read-out circuit (not shown) on the periphery of the array of pixels 24, 25 and thus provides a separate electric terminal of the pixel 24 in question.

Figure 5A:
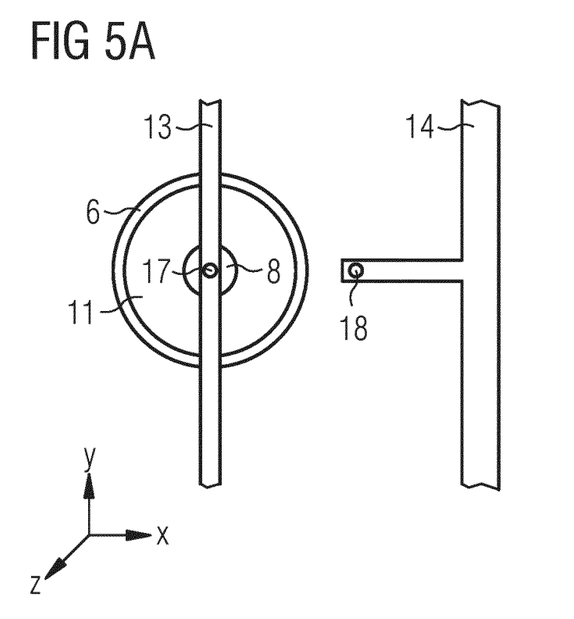
FIGS. 5A and 5B show top-views of different embodiments of a photodiode device.
Figure 5B:
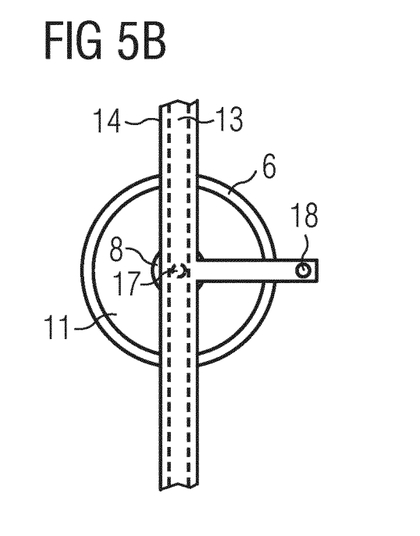

In FIGS. 5A and 5B different embodiments for contacting the doped well 6 and the doped region 9 are shown. FIG. 5A shows a detail of the embodiment according to FIG. 4.

It shows the further conductor track 14 comprising a short branch located opposite the doped well 6. The branch locally reduces the distance between the further conductor track 14 and the doped well 6 without reducing the distance between the conductor track 13 and the parallel sections of the further conductor track 14. Thus, the distance between the further conductor track 14 and the neighboring conductor track 13 can be made as large as possible without having to increase the distance between the contact plug 17 and the further contact plug 18. This may be desired in view of a low capacitance between the conductor track 13 and the further conductor track 14. Similar branches may instead or additionally be provided on the conductor track 13, which may in this case be arranged in positions that are laterally shifted from the positions above the centers of the doped well 6.

FIG. 5B shows a top-view of another embodiment for contacting the doped well 6 and the doped region 9. In the embodiment according to FIG. 5B, the further conductor track 14 is arranged above the conductor track 13. Hence, there is no lateral distance between the conductor track 13 and the further conductor track 14. In the stacked arrangement according to FIG. 5B, the conductor track 13 and the further conductor track 14 are formed in different metallization planes, which are isolated from one another by the wiring layer 12. The stacked arrangement has the advantage that the area, where incident electromagnetic radiation is shielded by the conductor track 13 and the further conductor track 14, is minimal. Furthermore, the stacked arrangement may be suitable in view of reducing the size of the device. In the top-view of FIG. 5B, the further conductor track 14 covers the conductor track 13, which is therefore represented by broken lines. The further conductor track 14 comprises a branch, which connects the further conductor track 14 with the further contact plug 18.

Both FIGS. 5A and 5B show the protection structure 11 forming a ring around the contact region 8 in lateral directions x, y. As shown, the outer diameter d5 of the protection structure 11 is slightly smaller than the lateral extent d1 of the doped well 6. In the transversal direction z the protection structure 11 is arranged below the conductor track 13 and the further conductor track 14. Therefore, from the viewer's perspective, the protection structure 11 is not visible at locations, where the conductor track 13 and the further conductor track 14 is arranged.

Figure 6:
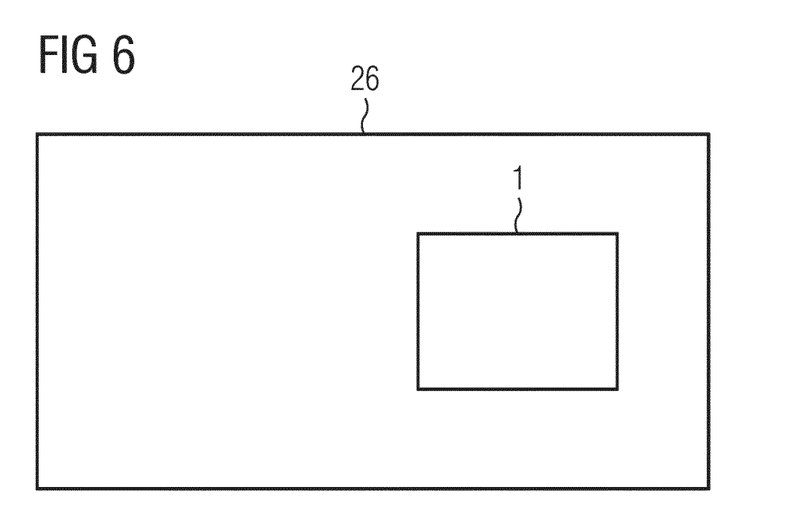
FIG. 6 shows a schematic diagram of an electronic system comprising a photodiode device.

FIG. 6 shows a schematic diagram of an exemplary embodiment of an electronic system 26 comprising a photodiode device 1 as discussed above. The electronic system 26 may in particular be a computed tomography system or any other optoelectronic system.

In FIGS. 7A to 7E an exemplary method for fabricating a photodiode device 1 is shown.

Figure 7A:
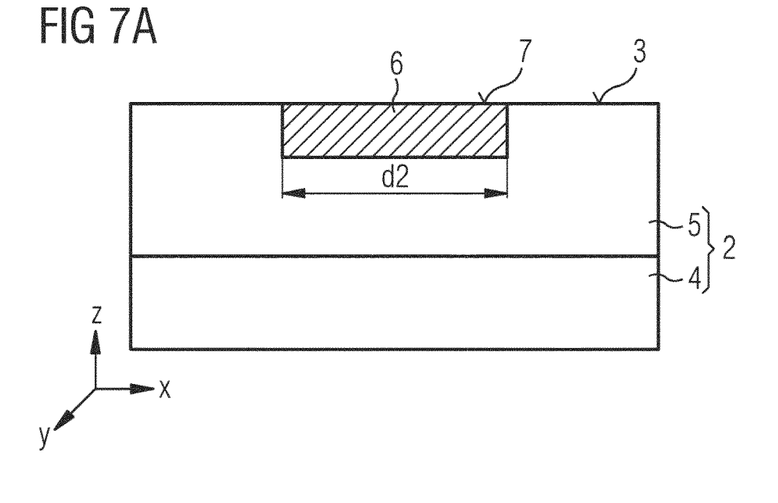
FIGS. 7A to 7F show an exemplary process flow for fabricating a photodiode device.

As shown in FIG. 7A, a semiconductor substrate 2 is provided. The substrate 2 comprises a highly doped wafer 4 and a lower doped epi-layer 5. The wafer 4 is a silicon wafer, for instance. The epi-layer 5 may be epitaxially grown on the wafer 4. This means that in the transversal direction z the epi-layer 5 is arranged above the wafer 4. The substrate 2 has a main surface 3, which is formed in this example by the epi-layer 5. The doping of the substrate 2 leads to the second type of electric conductivity, wherein the second type of electric conductivity is opposite to a first type of electric conductivity. For example, the electric conductivity of the substrate 2 is p-type by means of a boron impurity.

Moreover, at least one doped well 6 of the first type of electric conductivity is formed at the main surface 3 of the substrate 2 by means of a dopant implantation. For example, phosphorus or arsenic are used as dopants in the implantation step. The implantation domain has an extent d2 in lateral direction x, y. The implantation step for forming the doped well 6 could be followed by a thermal annealing step, which activates the doping and causes the dopants to diffuse deeper into the substrate 2. The doped well 6 comprises an upper surface 7, which forms a part of the main surface 3.

Figure 7B:
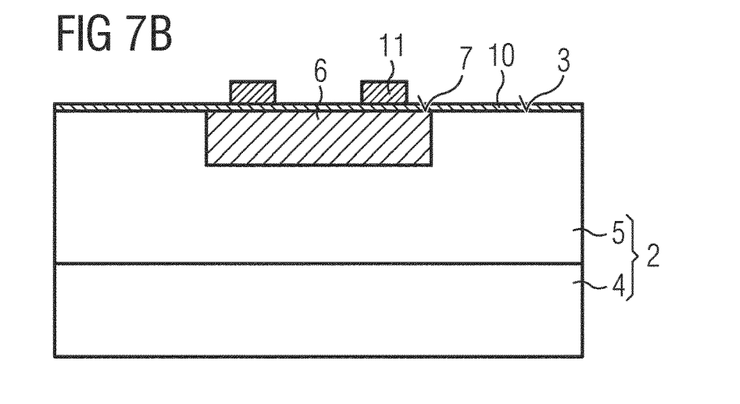

In the next steps according to FIG. 7B, a dielectric layer 10 is deposited on the main surface 3 of the substrate 2. The dielectric layer 10 can be a gate oxide layer. The dielectric layer 10 covers the main surface 3 of the substrate 2 and the upper surface 7 of the doped region 6. In the transversal direction z the dielectric layer 10 is arranged above the substrate 2. Besides, a protection structure 11 is deposited. The protection structure 11 can be formed by a polysilicon layer, which is structured by a photolithographic process. The protection structure 11 is arranged above the upper surface 7 of the doped well 6 in places, in particular at the periphery of the doped well 6. This means that the dielectric layer 10 is arranged between the doped well 6 and the protection structure 11. The protection structure 11 forms a ring or a frame in lateral direction x, y.

Figure 7C:
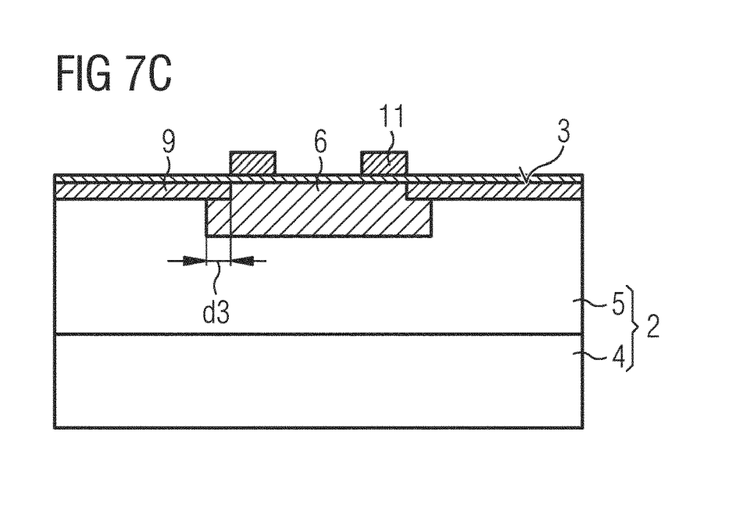

In the next step according to FIG. 7C a doped region 9 is formed at the main surface 3 of the substrate 2 by means of an implantation step with a further dopant. The further dopant can be, for example, boron. Thus, the doped region 9 is of the second type of electric conductivity. The doped region 9 is adjacent to the doped well 6. Moreover, the implantation domain for forming the doped region 9 can overlap the implantation domain for forming the doped well 6. Since the doping concentration of the doped region 9 is higher than the doping concentration of the doped well 6, the doped region 9 displaces the doped well 6 by an overlap d3 at the main surface 3 of the substrate 2. This means that at the main surface 3 the net doping in the overlap d3 is of the second type of electric conductivity. However, since the doped region 9 is shallower than the doped well 6, the doped well 6 is still present below the doped region 9 in places, where the implantation domains overlap.

Figure 7D:
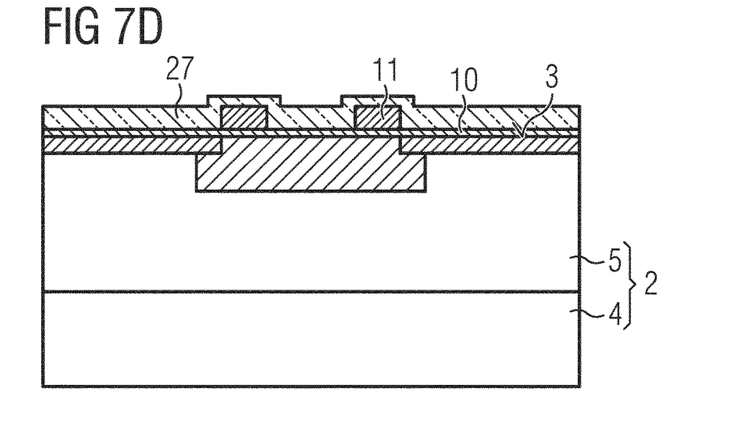

In the next step according to FIG. 7D a spacer layer 27 is deposited, the spacer layer 27 covering the main surface 3 of the substrate 2 and the protection structure 11. The spacer layer 27 also covers the dielectric layer 10. The spacer layer 27 may comprise a nitride or an oxide or a combination thereof. Due to the level difference caused by the protection structure 11 the spacer layer 27 is deposited non-uniformly. In particular, in regions adjacent to the protection structure 11 the thickness of spacer layer 27 can be slightly larger.

Figure 7E:
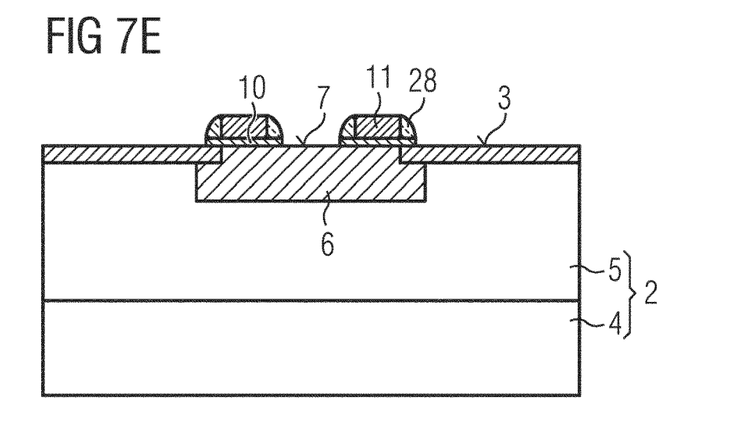

In the next step according to FIG. 7E the spacer layer 27 is removed by an etching process. By the same etching process also the dielectric layer 10 can be removed from the main surface 3. The etching process may be controlled by time, so that an over-etching can be conducted. The over-etching ensures that no residuals of the spacer layer 27 and the dielectric layer 10 remain on the main surface 3 of the substrate 2. However, since the thickness of the spacer layer 27 can be slightly larger in regions adjacent to the protection structure 11, so-called spacers 28 may remain next to the protection structure 11 after the etching step. Portions of the dielectric layer 10, which are arranged under the protection structure 11 and under the spacers 28 are not attacked by the etching process and remain on the upper surface 7 of the doped well 6.

The etching process could harm the upper surface 7 of the doped well 6, so that surface defects can occur. These surface defects could lead to an increased dark current of the photodiode device 1. However, in regions, where the protection structure 11 and the dielectric layer 10 is arranged on the doped well 6, the upper surface 7 is protected from the etching process for removing the spacer layer 27.

Figure 7F:
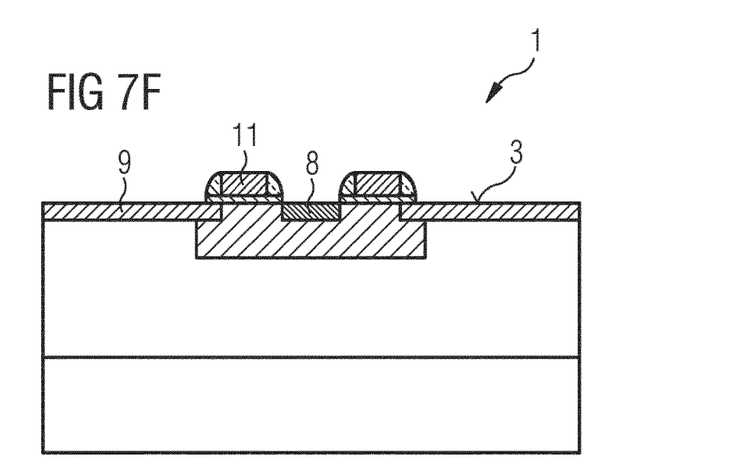

In the last step according to FIG. 7F a contact region 8 is formed by a further implantation step. The contact region 8 can be formed, for example, by implanting phosphorus or arsenic. Thus, the contact region 8 has the first type of electric conductivity. In lateral direction x, y the contact region 8 is surrounded by the protection structure 11, so that the protection structure 11 forms a ring or a frame around the contact region 8. Furthermore, at this point of the fabrication method a further implantation could be performed for the doped region 9 in order to increase its doping concentration. For this further implantation step boron dopants can be used. This way, the doped region 9 passivates the main surface 3 of the photodiode device 1 and ensures its radiation hardness.

The embodiments of the photodiode device 1 and of the method of producing the photodiode device disclosed herein have been discussed for the purpose of familiarizing the reader with novel aspects of the idea. Although preferred embodiments have been shown and described, many changes, modifications, equivalents and substitutions of the disclosed concepts may be made by one having skill in the art without unnecessarily departing from the scope of the claims.

It will be appreciated that the disclosure is not limited to the disclosed embodiments and to what has been particularly shown and described hereinabove. Rather, features recited in separate dependent claims or in the description may advantageously be combined. Furthermore, the scope of the disclosure includes those variations and modifications, which will be apparent to those skilled in the art and fall within the scope of the appended claims.

The term "comprising", insofar it was used in the claims or in the description, does not exclude other elements or steps of a corresponding feature or procedure. In case that the terms "a" or "an" were used in conjunction with features, they do not exclude a plurality of such features. Moreover, any reference signs in the claims should not be construed as limiting the scope.

The invention claimed is:
1. A photodiode device, comprising:
a semiconductor substrate with a main surface,
at least one doped well of a first type of electric conductivity at the main surface of the substrate, and
at least one doped region of a second type of electric conductivity arranged at the main surface of the substrate, the doped region being adjacent to the at least one doped well, wherein the second type of electric conductivity is opposite to the first type of electric conductivity, wherein
the at least one doped well and the at least one doped region are electrically contactable, and wherein
on a portion of an upper surface of the doped well a protection structure is arranged, where the upper surface is arranged at the main surface of the substrate, the protection structure protecting the doped well against defects at the upper surface and
in a top-view the extent of the protection structure is limited to the upper surface of the doped well.

2. The photodiode device according to claim 1, further comprising a contact region arranged on the upper surface of the doped well, the contact region having a doping concentration that is higher than the doping concentration of the doped well.

3. The photodiode device according to claim 1, wherein in a top-view the protection structure forms a ring or a frame around the contact region of the doped well.

4. The photodiode device according to claim 1, wherein the protection structure is configured to protect the doped well from defects caused by etching processes during fabrication.

5. The photodiode device according to claim 1, wherein the protection structure comprises poly-silicon.

6. The photodiode device according to claim 1, wherein the doped region comprises a higher doping concentration than the doped well.

7. The photodiode device according to claim 1, further comprising a dielectric layer arranged between the upper surface of the doped well and the protection structure.

8. The photodiode device according to claim 1, further comprising
a wiring layer arranged above the main surface of the substrate,
at least one conductor track, where the doped well is electrically connected to the conductor track, and
at least one further conductor track electrically connected to the at least one doped region, wherein
the conductor track and the further conductor track being embedded in the wiring layer.

9. The photodiode device according to claim 8, further comprising
a contact plug arranged on the contact region electrically connecting the conductor track to the doped well, and
a further contact plug arranged on the doped region, the further contact plug electrically connecting the further conductor track to the doped region.

10. The photodiode device according to claim 1, wherein the photodiode device comprises a plurality of doped wells with respective protection structures, the doped wells being spaced apart from each other and being adjacent to the at least one doped region, the doped wells being interconnected.

11. The photodiode device according to claim 10, wherein the plurality of doped wells is comprised by one pixel of an array of pixels of the photodiode device.

12. The photodiode device according to claim 1, wherein the electromagnetic radiation to be detected is in the infrared, the near-infrared or in the visible wavelength range, or in a range overlapping at least two of these wavelength ranges.

13. An electronic system comprising the photodiode device according to claim 1, wherein the electronic system is in particular a computed tomography system or any other optoelectronic system.

14. A method of producing a photodiode device, comprising
providing a semiconductor substrate,
forming, by implantation of a dopant, at least one doped well of a first type of electric conductivity at a main surface of the substrate,
depositing a protection structure on a portion of an upper surface of the doped well, where the upper surface is arranged at the main surface of the substrate,
depositing a spacer layer covering the main surface of the substrate and the protection structure,
removing the spacer layer by an etching process, wherein the protection structure protects the upper surface of the underlying doped well from the etching process, and
forming, by implantation of a further dopant, at least one doped region of a second type of electric conductivity at the main surface of the substrate, the doped region being adjacent to the at least one doped well, wherein the second type of electric conductivity is opposite to the first type of electric conductivity,
wherein in a top-view the extent of the protection structure is limited to the upper surface of the doped well.

15. The method of producing a photodiode device according to claim 14, further comprising forming by implantation a contact region on the upper surface of the doped well, so that in a top-view the protection structure forms a ring or a frame around the contact region of the doped well, and wherein the contact region has a doping concentration that is higher than the doping concentration of the doped well.

16. The method of producing a photodiode device according to claim 14, wherein in lateral directions an implantation domain for forming the at least one doped well overlaps a further implantation domain for forming the at least one doped region, where lateral directions extend parallel to a main plane of extension of the substrate.

* * * * *